US006338922B1

(12) United States Patent
Liebmann et al.

(10) Patent No.: US 6,338,922 B1
(45) Date of Patent: Jan. 15, 2002

(54) OPTIMIZED ALTERNATING PHASE SHIFTED MASK DESIGN

(75) Inventors: Lars W. Liebmann, Poughquag; Alfred K. Wong, Beacon, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/566,885

(22) Filed: May 8, 2000

(51) Int. Cl.[7] ............................. G03F 9/00; G06F 17/50
(52) U.S. Cl. ............................................. 430/5; 716/21
(58) Field of Search ..................... 430/5, 322; 716/19, 716/20, 21; 250/492.22

(56) References Cited

U.S. PATENT DOCUMENTS

| | | | |
|---|---|---|---|
| 5,537,648 A | 7/1996 | Liebmann et al. | 395/500 |
| 5,636,131 A | 6/1997 | Liebmann et al. | 716/19 |
| 5,807,649 A | 9/1998 | Liebmann et al. | 430/5 |
| 5,858,580 A | 1/1999 | Wang et al. | 430/5 |
| 5,883,813 A | 3/1999 | Kim et al. | 716/19 |
| 6,057,063 A * | 5/2000 | Liebmann et al. | 430/5 |

OTHER PUBLICATIONS

Levenson, M. D., *Phase–Shifting Mask Strategies: Isolated Dark Lines. Microlithography World*, (Mar./Apr. 1992) pp. 6–12.

Friedrich, Christoph et al., *Evaluating the Potential of Alternating Phase Shift Masks Using Lithography Simulation*, SPIE vol. 3679, pp. 590–599, Jul. 1999.

* cited by examiner

*Primary Examiner*—S. Rosasco
(74) *Attorney, Agent, or Firm*—DeLio & Peterson, LLC; Peter W. Peterson; Susan M. Murray

(57) ABSTRACT

A method for reducing lens aberrations sensitivity and proximity effects of alternating phase shifted masks is described. The critical features of a chip design layout are first identified. Multiple, narrow phase regions and auxiliary phase transitions, which provide additional opaque features, are then formed alongside the critical features such that a grating pattern of substantially uniform pitch is printed. Together with a complementary trim mask, the circuit pattern so delineated has reduced sensitivity to lens aberrations and proximity effects.

33 Claims, 11 Drawing Sheets

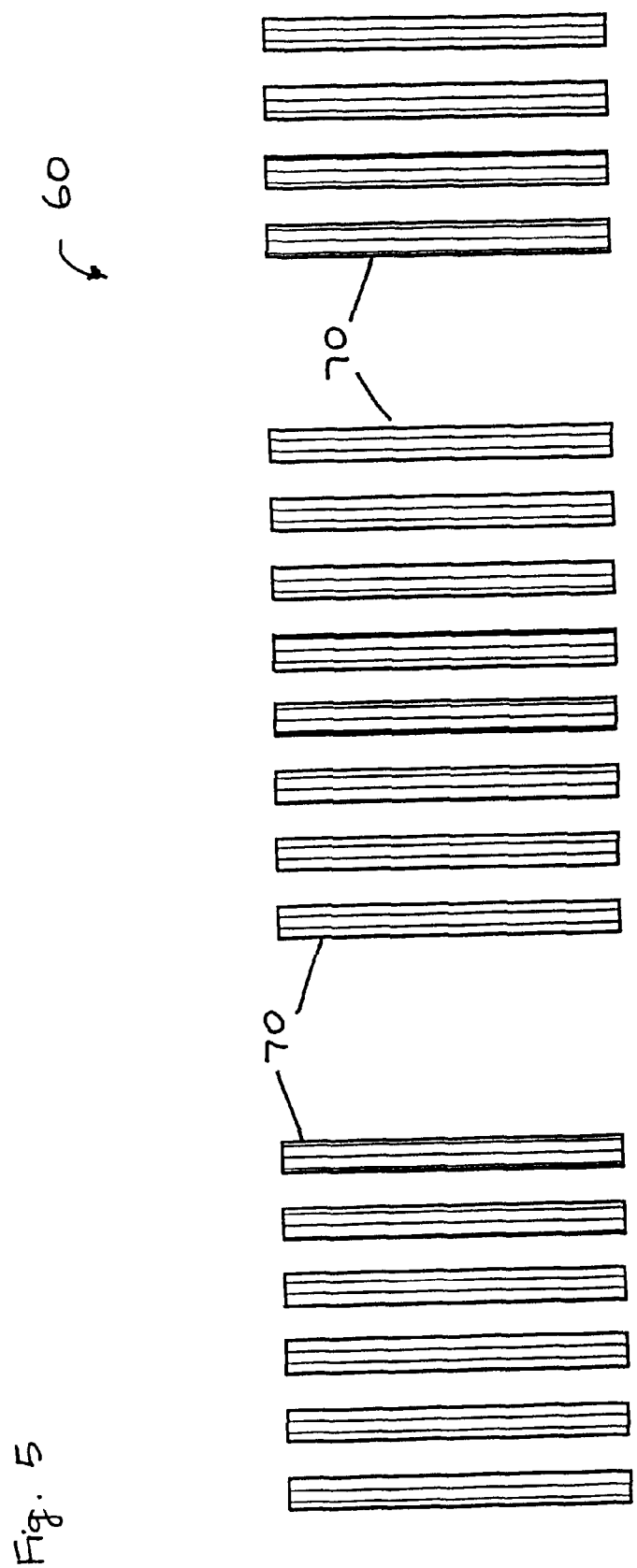

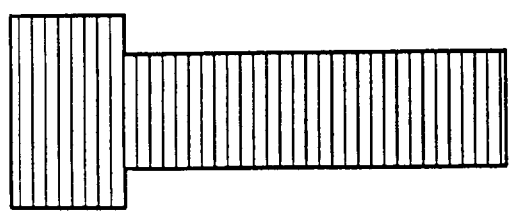
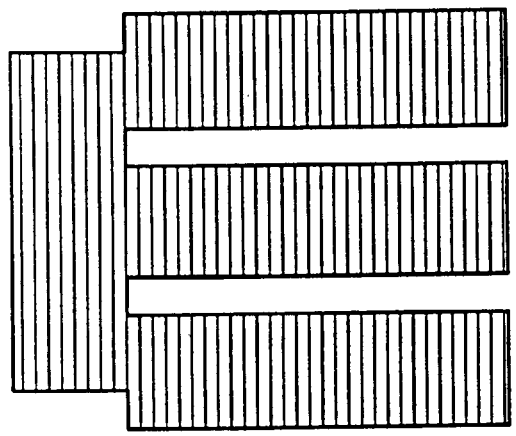
Fig. 6
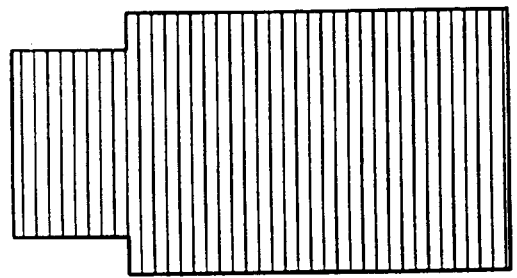

OPTIMIZED ALTERNATING PHASE SHIFTED MASK DESIGN

BACKGROUND OF THE INVENTION

1. Field of the Invention

The present invention relates to the manufacture of very large scale integrated (VLSI) circuit devices. In particular, the present invention provides a method and apparatus for converting a chip design into a phase shifted mask design for producing the chip.

2. Description of Related Art

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending with the removal of the expended photoresist to make way for the new resist to be applied for another iteration of this process sequence.

The basic lithography system consists of a light source, a stencil or photo mask containing the pattern to be transferred to the wafer, a collection of lenses, and a means for aligning existing patterns on the wafer with patterns on the mask. The aligning may take place in an aligning step or steps and may be carried out with an aligning apparatus. Since a wafer containing from 50 to 100 chips is patterned in steps of 1 to 4 chips at a time, these lithography tools are commonly referred to as steppers. The resolution, R of an optical projection system such as a lithography stepper is limited by parameters described in Raleigh's equation:

$$R = k\lambda/NA$$

Where $\lambda$ represents the wavelength of the light source used in the projection system and NA represents the numerical aperture of the projection optics used. "k" represents a factor describing how well a combined lithography system can utilize the theoretical resolution limit in practice and can range from about 0.8 down to about 0.5 for standard exposure systems. The highest resolution in optical lithography is currently achieved with deep ultra violet (DUV) steppers operating at 248 nm, wavelengths of 356 nm are also in widespread use and 193 nm wavelength lithography is becoming commonplace.

Conventional photo masks consist of chromium patterns on a quartz plate, allowing light to pass wherever the chromium has been removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which allow a developer to dissolve and remove the resist in the exposed areas. (Negative resist systems allow only unexposed resist to be developed away.) The photo masks, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found (light on, light off).

The conventional photo masks are commonly referred to as chrome on glass (COG) binary masks, due to the binary nature of the image amplitude. The perfectly square step function of the light amplitude exists only in the theoretical limit of the exact mask plane. At any given distance away from the mask, such as in the wafer plane, diffraction effects will cause images to exhibit a finite image slope. At small dimensions, that is, when the size and spacing of the images to be printed are small relative to the $\lambda/NA$, electric field vectors of adjacent images will interact and add constructively. The resulting light intensity curve between the features is not completely dark, but exhibits significant amounts of light intensity created by the interaction of adjacent features. The resolution of an exposure system is limited by the contrast of the projected image, that is, the intensity difference between adjacent light and dark features. An increase in the light intensity in nominally dark regions will eventually cause adjacent features to print as one combined structure rather than discrete images.

The quality with which small images can be replicated in lithography depends largely on the available process latitude; that is, that amount of allowable dose and focus variation that still results in correct image size. Phase shifted mask (PSM) lithography improves the lithographic process latitude or allows operation at a lower k value by introducing a third parameter on the mask. The electric field vector, like any vector quantity, has a magnitude and direction, so, in addition to turning the electric field amplitude on and off, it can be turned on with a phase of about 0° or turned on with a phase of about 180°. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude but point in exactly opposite directions so that any interaction between these light beams results in perfect cancellation. For more information on PSMs, please see "Phase-Shifting Mask Strategies: Isolated Dark Lines". Mark D. Levenson, Microlithography World, March/April 1992, pp. 6–12, the entire contents of which are hereby incorporated by reference.

Even though resolution enhancement through the use of hard phase shifted masks (frequency doubling masks) has been extensively proven, implementation of this technique is critically dependent on computer assisted (CAD) technology that can modify existing circuit designs to incorporate the additional design levels needed to build a phase shifted mask. Design modifications consist of defining regions on the mask that require phase shifting (i.e., by etching into the mask substrate) relative to the rest of the mask, and of creating shapes that are to eliminate lines printed by unwanted phase edges. The basic concept of creating a phase transition across any small feature is easily realized and can be done, given sufficient time, on a graphics terminal by hand. The challenge that needs to be met before introducing hard phase shifters to VLSI product programs lies in the rapid, reliable design modifications of complex chip designs.

Alternating Phase Shifted Mask (altPSM) lithography is recognized throughout the industry as a prime candidate for high resolution patterning of critical product levels. Specifically, altPSM is being proposed as the lithography solution for patterning of logic gate levels by all major IC manufacturers for the 130 nm SIA technology node. A major issue in the imaging of bright field layouts, i.e. layouts that seek to print dark line patterns in a clear background, with altPSM is the fact that the altPSM design and manufacturing process forces closed loop topologies on the phase shapes. Phase shapes have to be designed as polygons, only a subset of the phase polygon edges actually contributes to the imaging of the desired patterns, the rest are present only to close the shape that defines the etched area on the photomask. The same destructive interference of light that is exploited in the fundamental principle of alternating PSM also causes images to be printed by these residual phase edges.

Several approaches have been experimented with to eliminate the image of the residual phase edge in a single exposure technique. Unfortunately, all these approaches falter at layout densities required to support aggressive high resolution lithography. The IC industry has therefore accepted the additional cost and complexity of two exposure alternating PSM technique. In the two exposure technique, the altPSM exposure is complemented with a second exposure into the same undeveloped photo resist that was exposed by the altPSM to create an incoherent sum of two images that resemble the target image of the layout. Initial embodiments of the two exposure altPSM process used an altPSM layout that included all the layout shapes of the original design plus the 180° phase regions adjacent to all critical feature segments. The second, trim mask, exposure consisted of a generally opaque (dark field) mask with openings placed in order to allow light to expose the images left by the shadows projected by the residual phase edges.

While the lithographic benefits of altPSMs in enhancing the process window of critical features have been clearly demonstrated, in reality, it is the common process window, i.e., the process window shared by features of various pitches, that determines the overall process window achievable by any lithography technique. Proximity effects, i.e., changes in printed line width based on the local environment a structure is located in, will shift the process window for various structures to different nominal exposure doses, reducing the common overlap region between the process windows, thereby yielding a process with reduced common process window. In altPSM, it is well known in the lithography community that proximity effects are largely influenced by the width of the phase region adjacent to the printed structure.

Furthermore, it is important to account for secondary lithography effects such as lens aberrations in the simulations used to optimize a phase shifted design. One key measurable parameter to assess the impact of process errors such as lens aberrations on lithographic process window is the linewidth variation introduced by their presence.

It can be shown that for a realistic set of lens aberrations encountered in current production exposure tools the overall chip quality will be limited by the linewidth errors introduced by aberrations on the isolated lines to the point of obliterating any benefit of using altPSM over other lithography techniques.

Bearing in mind the problems and deficiencies of the prior art, it is therefore an object of the present invention to provide a method which optimizes the common process window achievable with altPSM in the presence of lens aberrations and proximity effects.

It is another object of the present invention to provide a method of generating a mask layout utilizing altPSM to generate superior linewidth quality in the presence of lens aberrations and proximity effects.

A further object of the invention is to provide a method of altPSM lithography which can overcome the problems associated with lens aberrations and proximity effects in existing manufacturing processes and currently installed tool sets.

It is yet another object of the present invention to provide an altPSM which reduces the effects of lens aberrations for use in double exposure PSM lithography.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of improving across field line width variation in alternating phase shifted mask lithography comprising the steps of: providing a chip layout having a plurality of features; determining which of the plurality of features are critical features; forming a plurality of phase regions on either side of the critical features such that a grating pattern of substantially uniform pitch is formed on a mask layout; providing a complementary mask pattern to selectively erase undesired printed images of the grating pattern; and reconstructing features of the chip layout to form a desired mask layout.

The method of this aspect may further include the step of: forming auxiliary phase transitions as determined by available space between the plurality of phase regions such that a grating pattern of substantially uniform pitch is formed on a mask layout comprising the plurality of features and the auxiliary phase transitions. Additional steps may include forming auxiliary phase transitions determined by available space surrounding the critical features; and forming additional phase regions on either side of the auxiliary phase transitions as needed. Preferably, during the step of forming auxiliary phase transitions, a width of the auxiliary phase transition is substantially equal to a width of a most narrow one of the critical features. Preferably, during the step of forming auxiliary phase transitions, a minimum spacing required to form the auxiliary phase transition is substantially equal to two phase region widths plus one auxiliary phase transition width. Preferably, in the step of forming a plurality of phase regions, a width of each phase region is substantially equal to a minimum spacing between the critical shapes. In the step of forming alternating phase regions, the phase regions formed on either side of the critical features are substantially different by 180°, most preferably, the phase regions formed on either side of the critical features are about 0° and about 180°.

Advantageously, the step of forming phase regions of uniform width enhances across field line width variation by reducing sensitivity of the mask layout to lens aberrations. Furthermore, the step of forming phase regions of uniform width enhances across field line width variation by reducing sensitivity of the mask layout to phase width dependent line width bias.

In a second aspect, the present invention is directed to a method of reducing the effects of lens aberrations in alternating phase shifted mask lithography comprising the steps of: providing a chip layout having a plurality of features; determining which of the plurality of features are critical features; forming auxiliary phase transitions as determined by available space surrounding the critical features; forming phase regions of uniform width on either side of the critical features and the auxiliary phase transitions such that a grating pattern of substantially uniform pitch is formed on a mask layout; providing a complementary mask pattern to selectively delete any undesired printed images of the grating pattern; and reconstructing the features of the chip layout by deleting any undesired printed images of the grating pattern with the complementary mask pattern.

Preferably, the step of forming phase regions of uniform width is determined by available spacing between the critical features of the mask layout. During the step of forming phase regions, each phase region may be substantially equal in width to a minimum spacing between critical features. During the step of forming auxiliary phase transitions, a width of the auxiliary phase transition may be substantially equal to a width of a most narrow one of the critical features.

In a third aspect, the present invention is directed to a method of generating a mask layout comprising the steps of: providing a chip layout having a plurality of features; determining which of the plurality of features are critical features; forming phase regions of uniform width on either side of the critical features, the width of the phase regions substantially equal to a minimum spacing between the critical features, the phase regions alternating by about 180°; forming auxiliary phase transitions as determined by available space between the phase regions such that a grating pattern of substantially uniform pitch is formed on a mask layout comprising the critical features and the auxiliary phase transitions; forming additional phase regions alongside the auxiliary phase transitions; providing a complementary mask pattern to selectively delete any undesired printed images of the grating pattern; and reconstructing the critical features of the mask layout by deleting any undesired printed images of the grating pattern with the complementary mask pattern.

This aspect may further include the step of printing the mask layout using a first exposure such that a grating pattern is formed in an exposed photoresist layer of a target substrate; and the step of printing the complementary mask pattern using a second exposure to delete any undesired printed images of the grating pattern formed in a first exposure.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
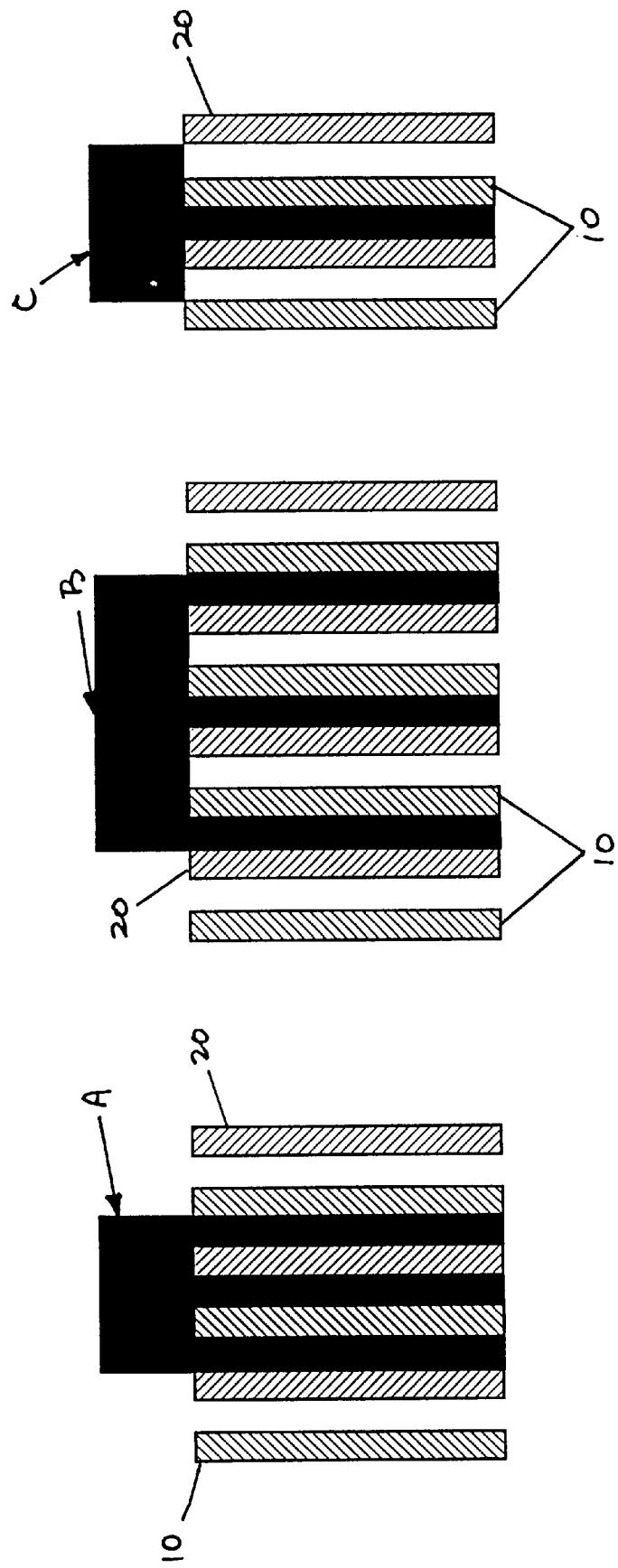
FIGS. 1–7 are top plan views of a phase shifted layout generated in accordance with a first preferred embodiment of the present invention.

In describing the preferred embodiment of the present invention, reference will be made herein to FIGS. 1–11 of the drawings in which like numerals refer to like features of the invention. Features of the invention are not necessarily shown to scale in the drawings.

The present invention provides a simple and novel method of reducing the undesirable effects of lens aberrations and proximity effects during the photolithography process of a desired mask pattern using multiple and uniform phase shifted regions to define the line regions of the desired mask pattern. Manufacturers may practice the method of the present invention with currently installed tool sets and equipment.

In FIG. 1 is shown an enhanced phase shifted mask layout having features or line regions A, B and C illustrated in solid black lines wherein line region A is most nested and line region C comprises a single isolated line. On either side of each single line (shown here as vertical, solid black lines) are alternating phase regions 10 and 20 representing a 180° phase and 0° phase, respectively. The width of each alternating phase region is determined by the amount of space between two lines in the most nested region of the mask pattern. Thus, the width of alternating phase regions 10 and 20 are dictated by the width of spacing between the lines in line region A as they are the most critical features.

Figure 2:
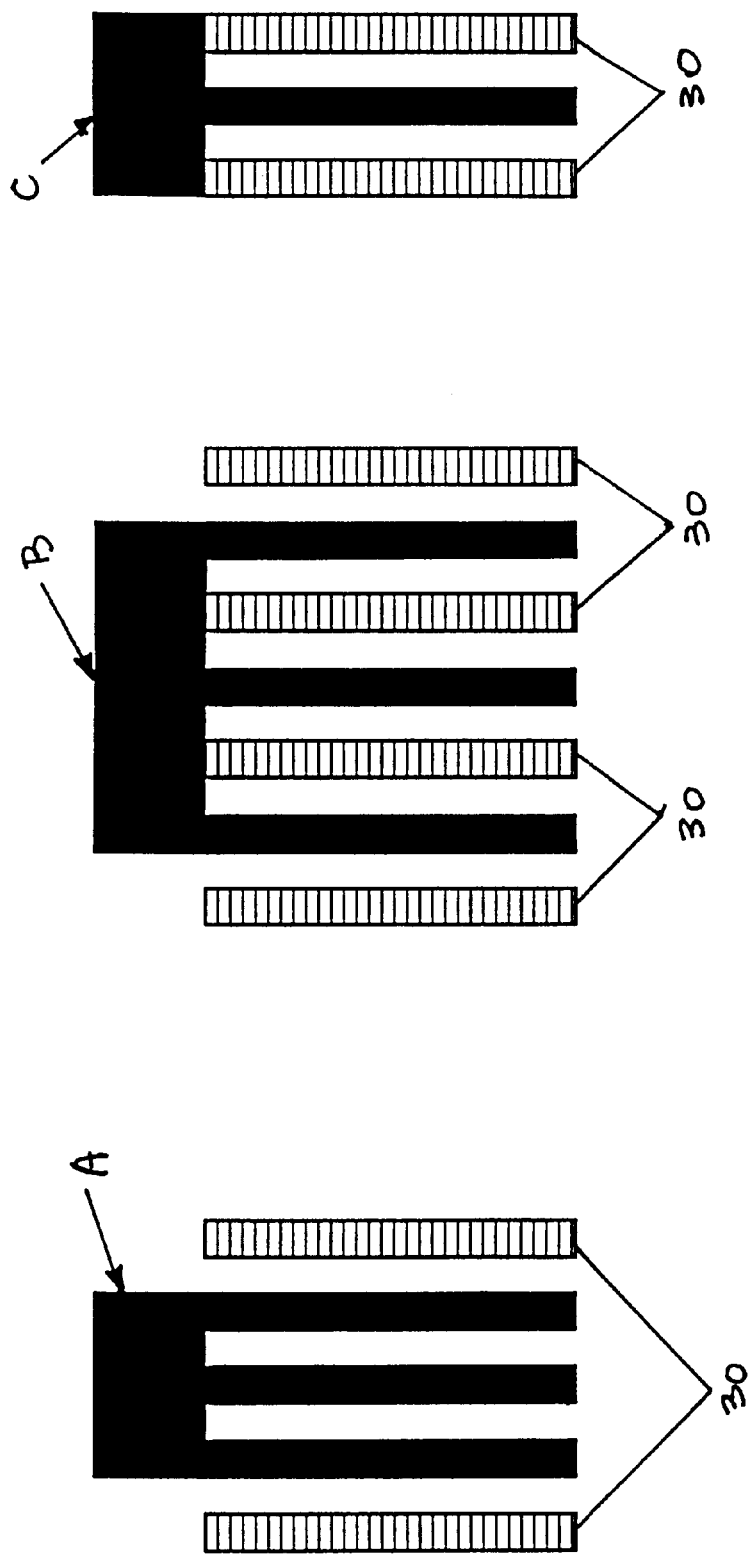
Figure 3:
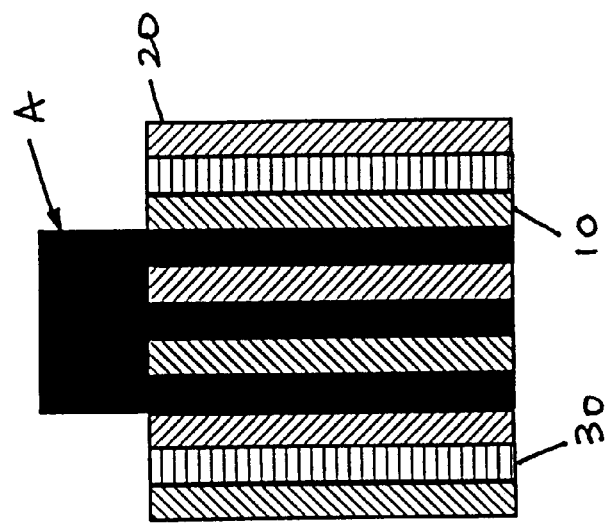
Figure 3:
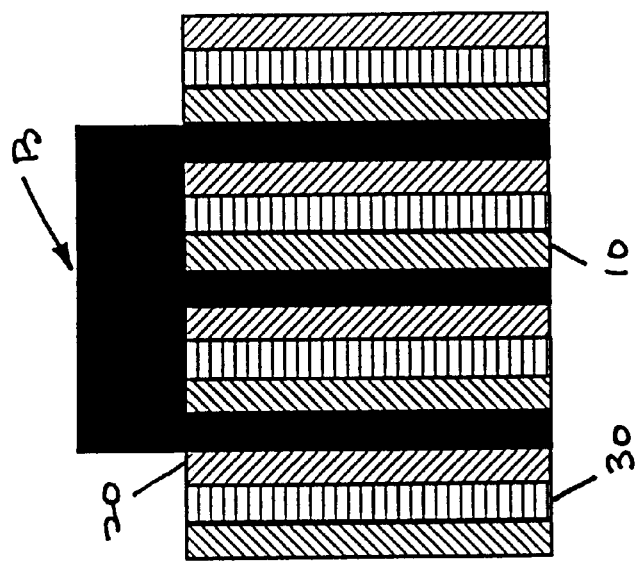
Figure 3:
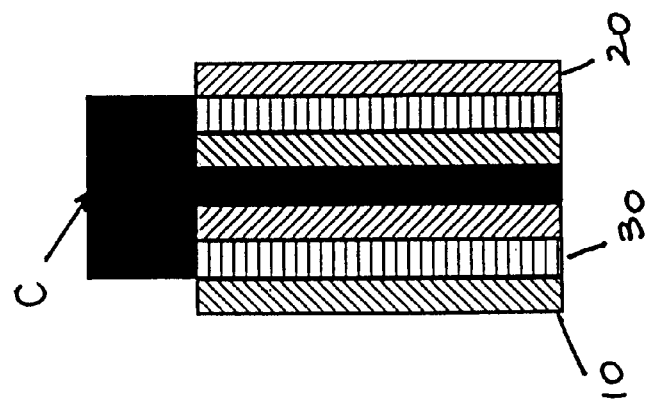

In order to create the enhanced phase shifted mask layout of FIG. 1, the design methodology begins with FIG. 2 wherein the desired image of each line region is again shown in solid black. Auxiliary phase transitions 30, or additional opaque regions, are formed adjacent to the line regions and spaced equidistant from each line within the line region. The auxiliary phase transitions are of uniform width dictated by the width of the critical features as in line region A. Alternating phase regions 10 and 20 are then formed beside the line and auxiliary phase transitions 30 as shown in FIG. 3.

Figure 4:
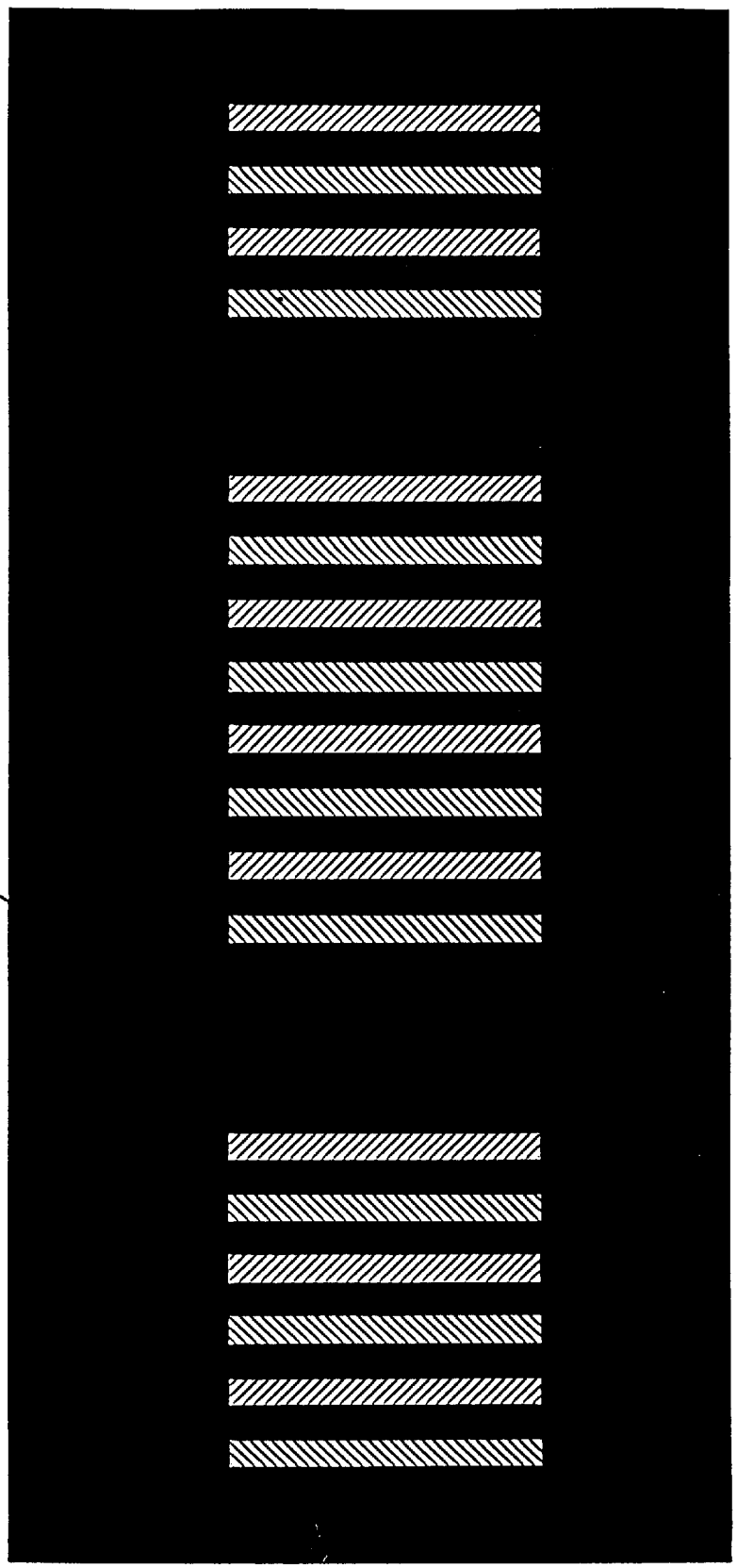
Figure 7:
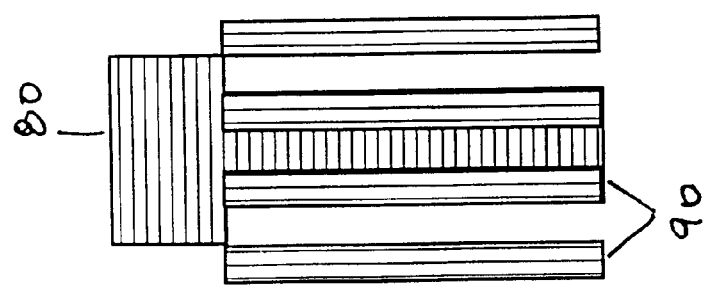
Figure 7:
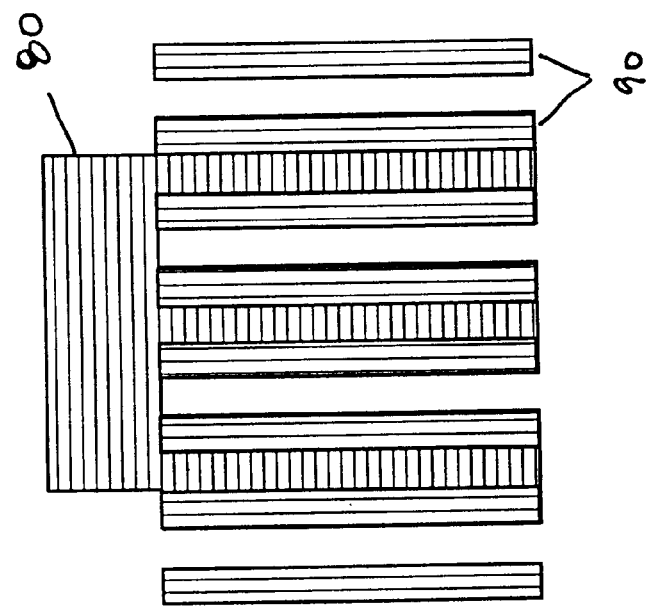
Figure 7:
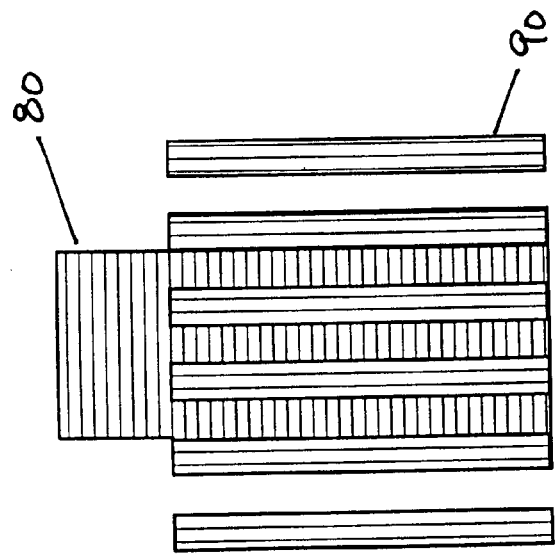
Figure 5:
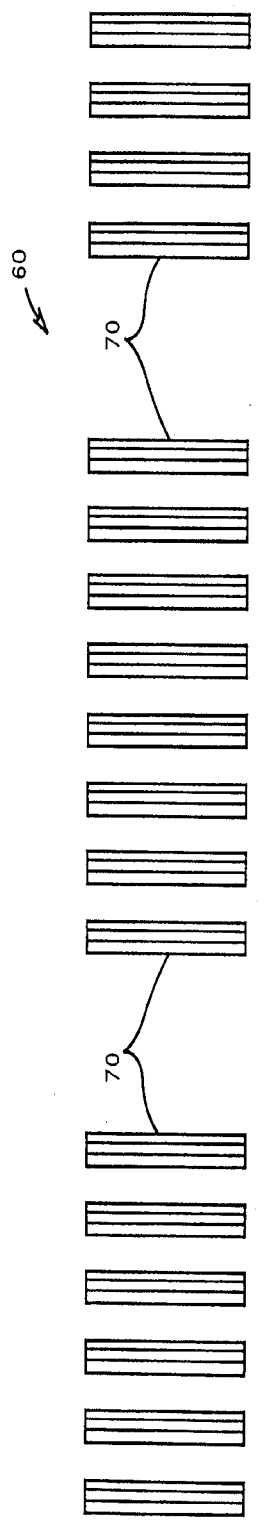

FIG. 4 illustrates the mask pattern 35 resulting from the alternating phase regions and the auxiliary phase transitions which resemble a grating pattern of closely spaced lines grouped by line regions A, B and C. Thus, a mask formed in accordance to this pattern would comprise chrome 40 patterned according to the lines of line regions A, B and C. Areas devoid of chrome with the cross-hatching represent alternating phase regions 20. Upon exposing mask pattern 35 onto a photoresist layer disposed on a target substrate, the enhanced phase mask image 60 is shown in FIG. 5. The exposed photoresist areas 70 correspond to the phase mask pattern of FIG. 4 wherein contrary to the prior art, the mask image comprises multiple lines having uniform width and spacing.

Figure 6:
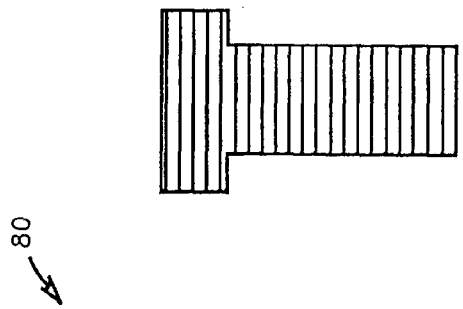
Figure 6:
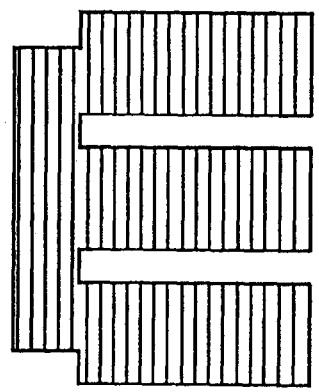
Figure 6:
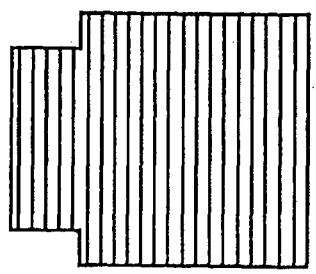
Figure 7:
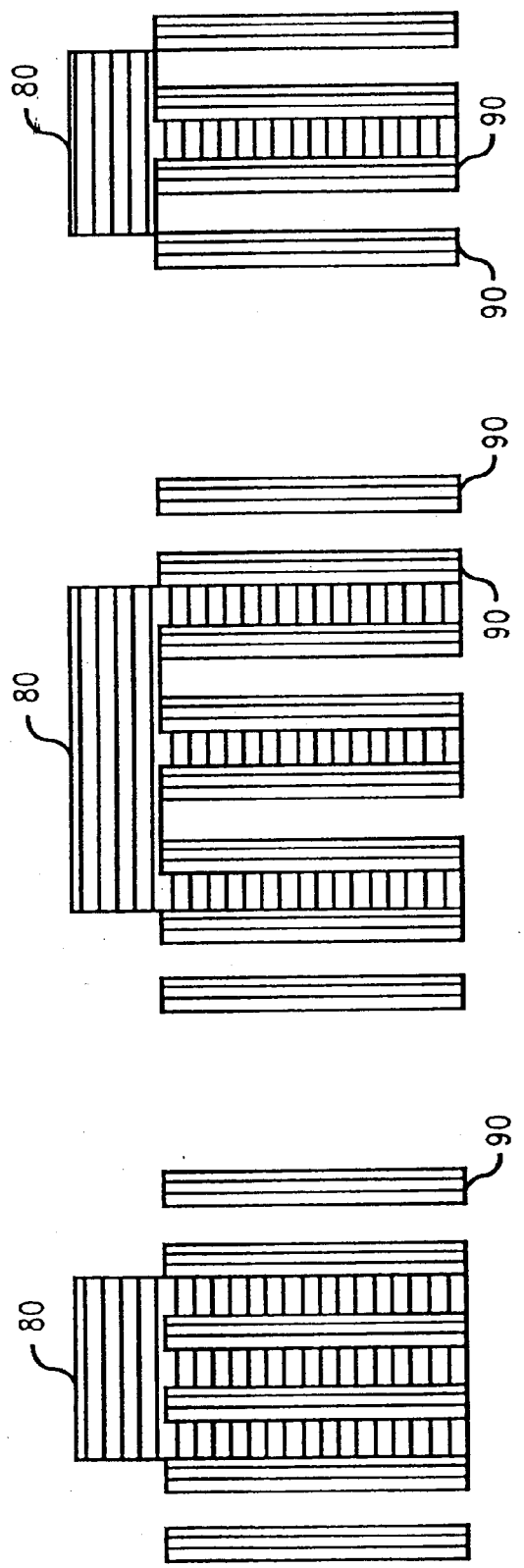
Figure 8:
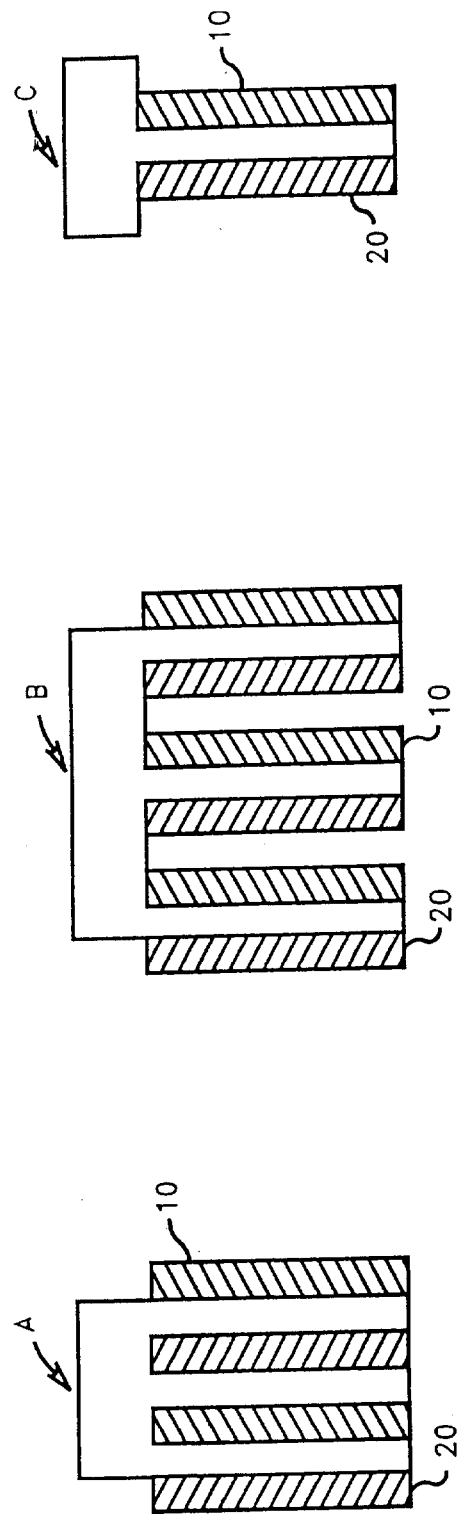
Figure 9:
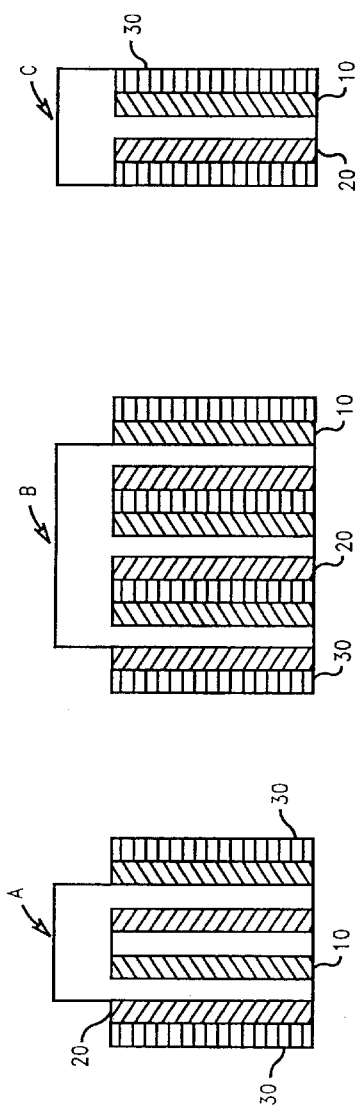
Figure 10:
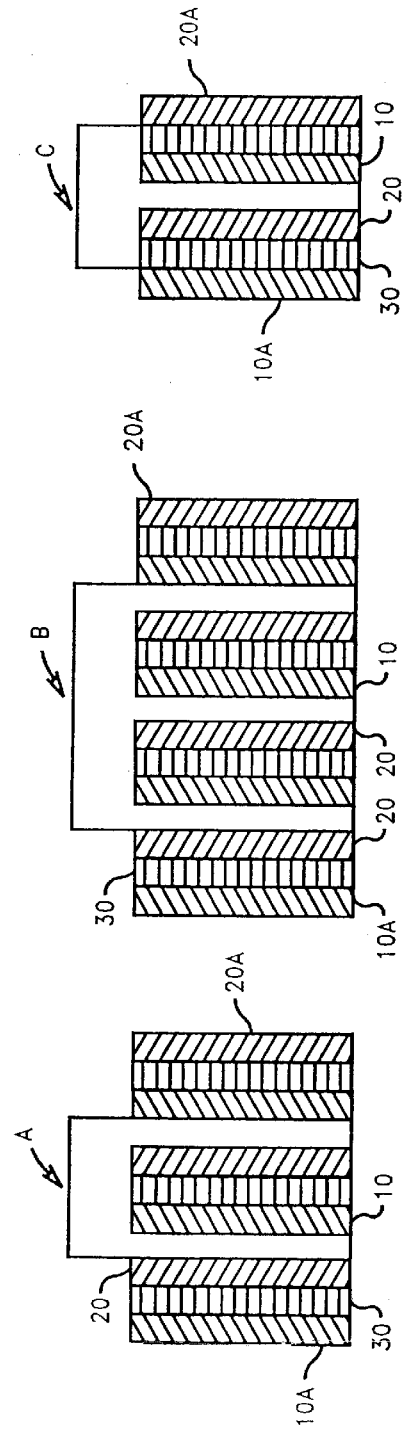
Figure 11:
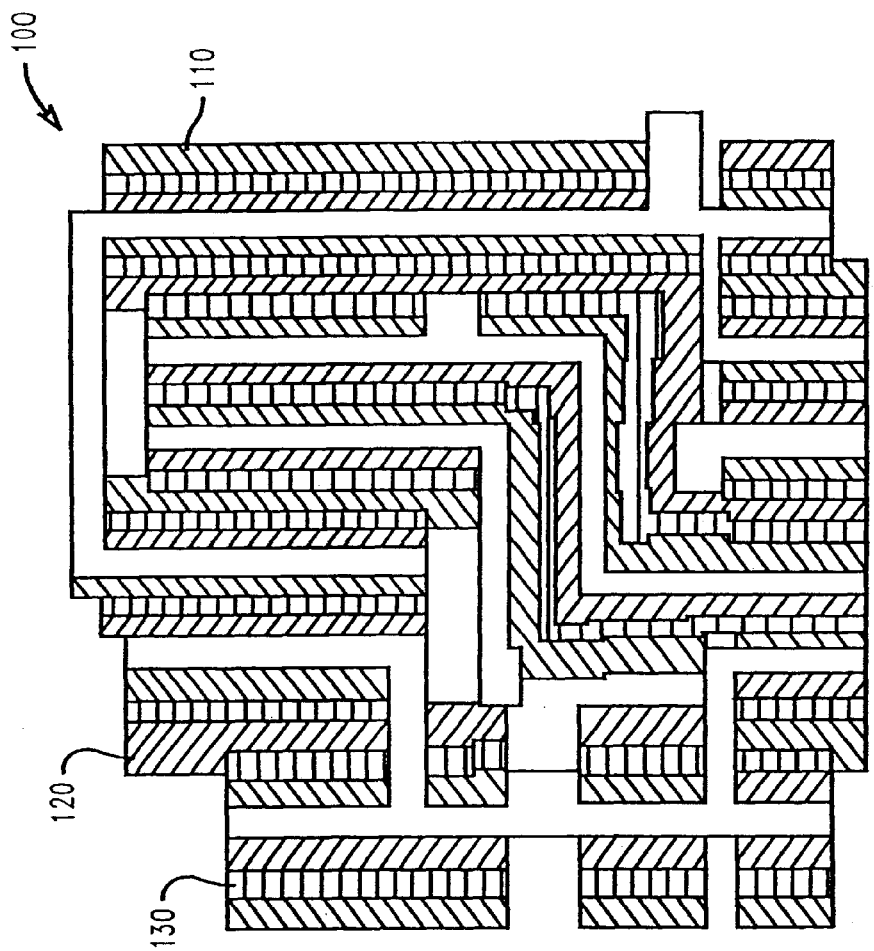

To further develop the desired phase shifted mask layout, a second exposure using a complementary mask pattern, a trim mask, deletes the portions of the auxiliary phase transitions while protecting the desired aspects of the exposed mask pattern. In FIG. 6 is shown a trim mask which corresponds to each of the line regions A, B and C. The pattern of the trim mask is exposed onto the photoresist to yield the final image shown in FIG. 7. The double exposure pattern is represented by the horizontal hatching areas 80. Vertical hatching areas 90 will not be seen in the final image. The final image of the phase shifted mask layout is less affected by the undesirable effects of lens aberrations and proximity effects while the technique may be used with existing tool sets. Preferably, the complementary mask pattern comprises a bright field block mask when the mask layout is a dark field alternating phase shifted mask. Alternatively, the complementary mask pattern comprises a dark field trim mask when the mask layout is a bright field alternating phase shifted mask.

Figure 8:
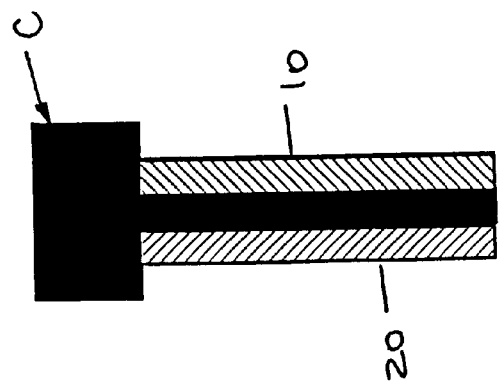
FIGS. 8–10 are top plan views of a phase shifted layout generated in accordance with a second preferred embodiment of the present invention.
Figure 8:
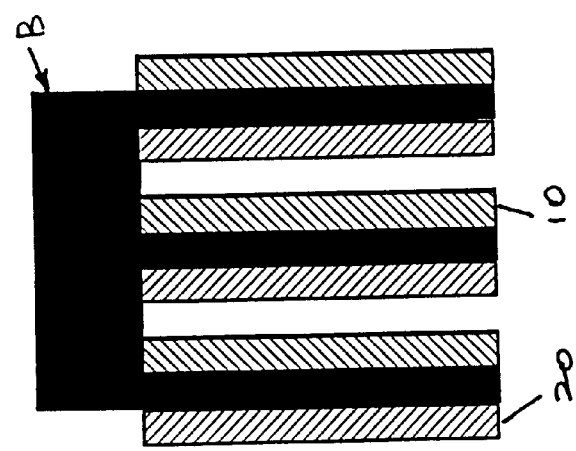
Figure 8:
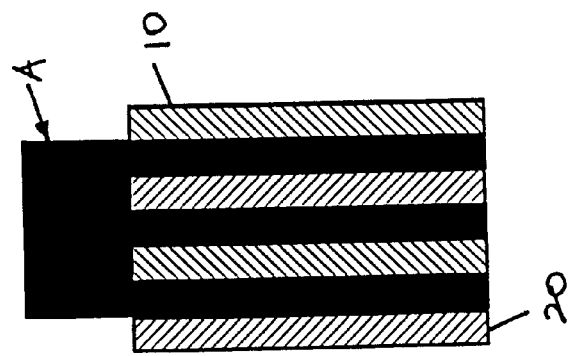
Figure 9:
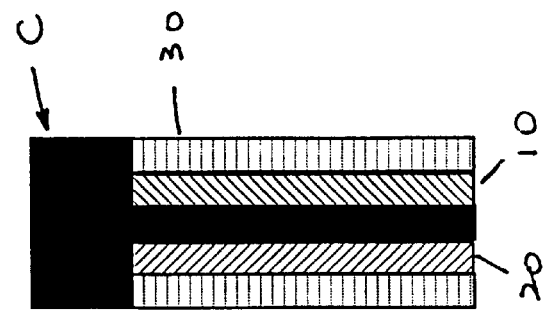
Figure 9:
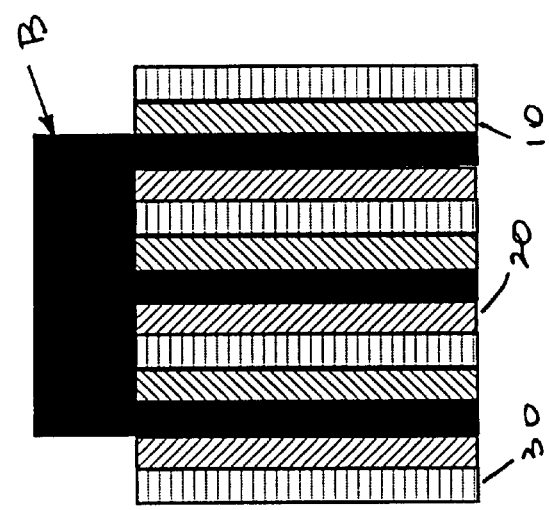
Figure 9:
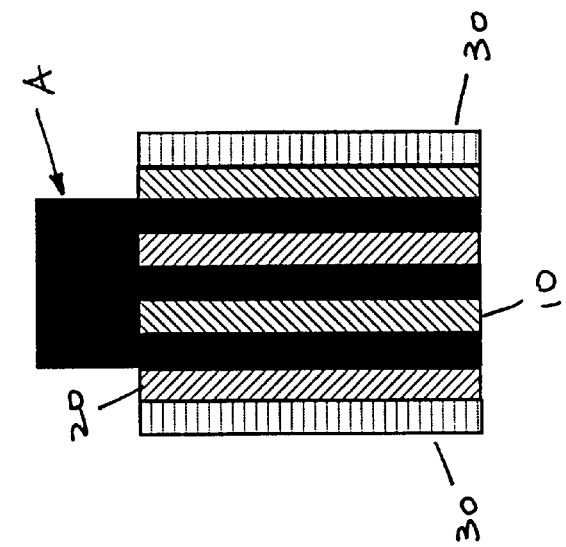
Figure 10:
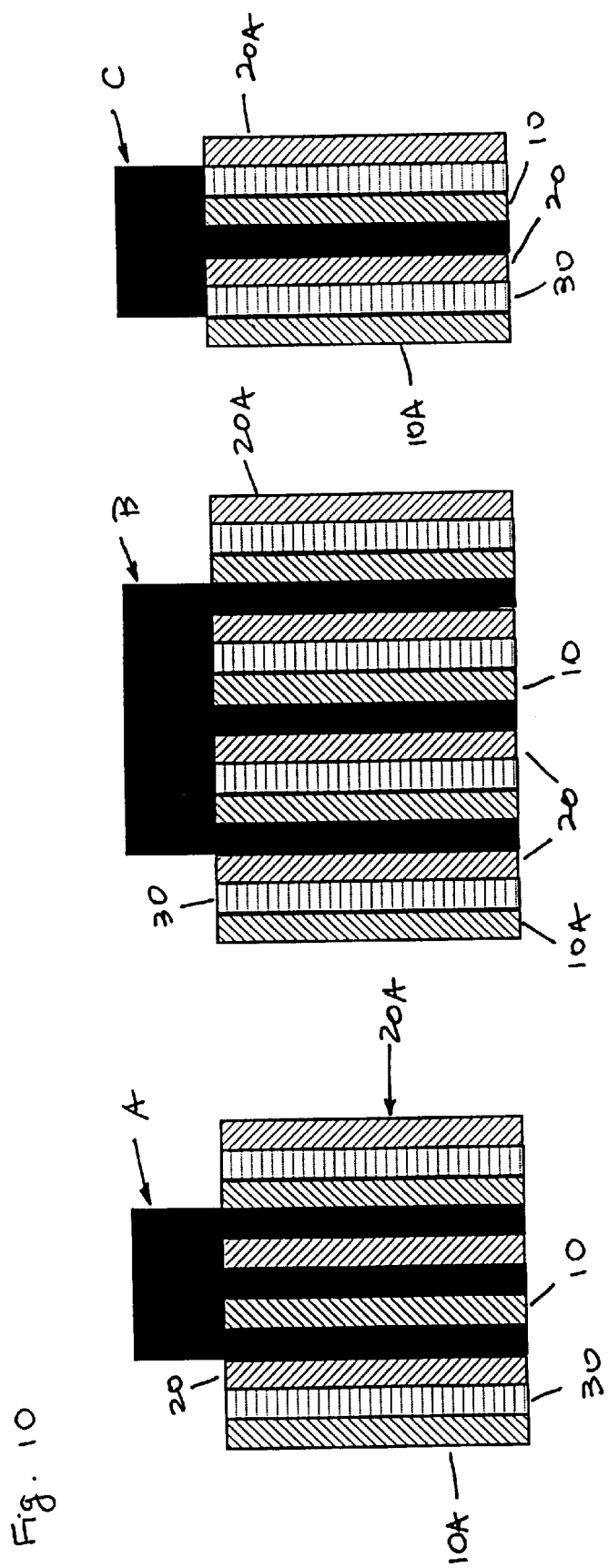
Figure 11:
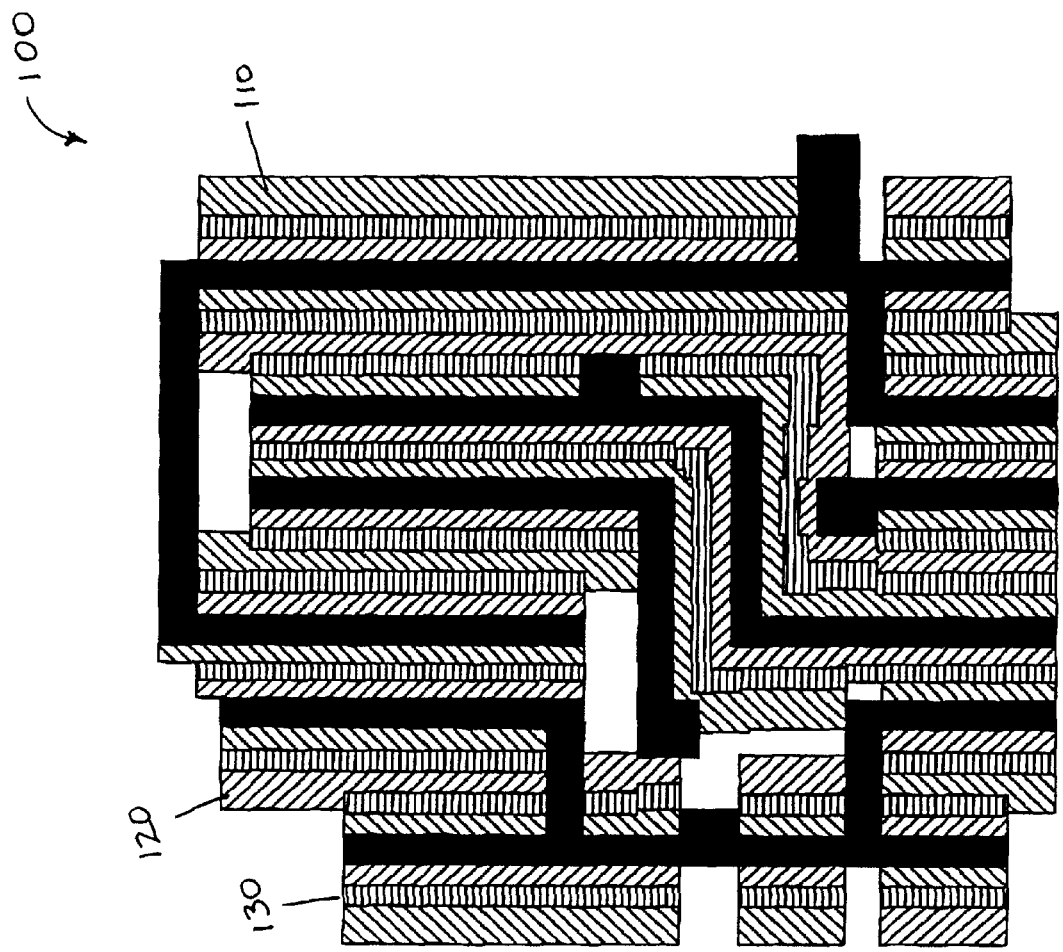
FIG. 11 is a top plan view of an enhanced phase shifted mask layout generated in accordance with the present invention.
Figure 1:
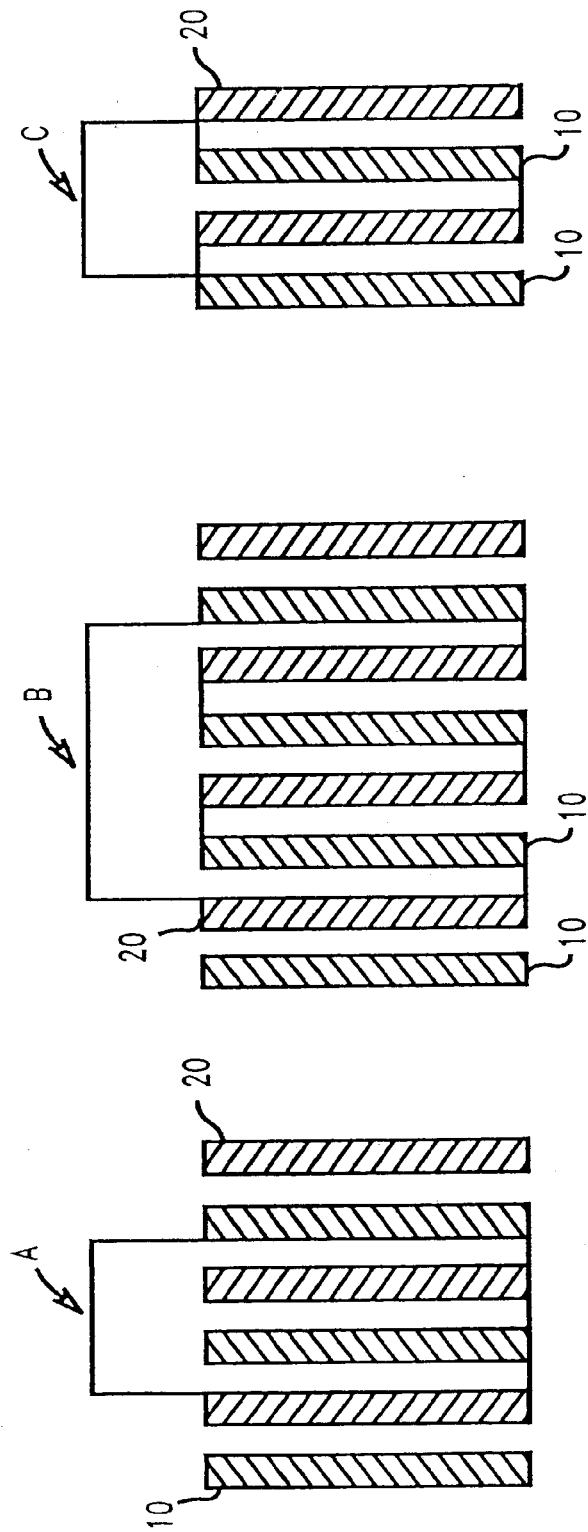
Figure 3:
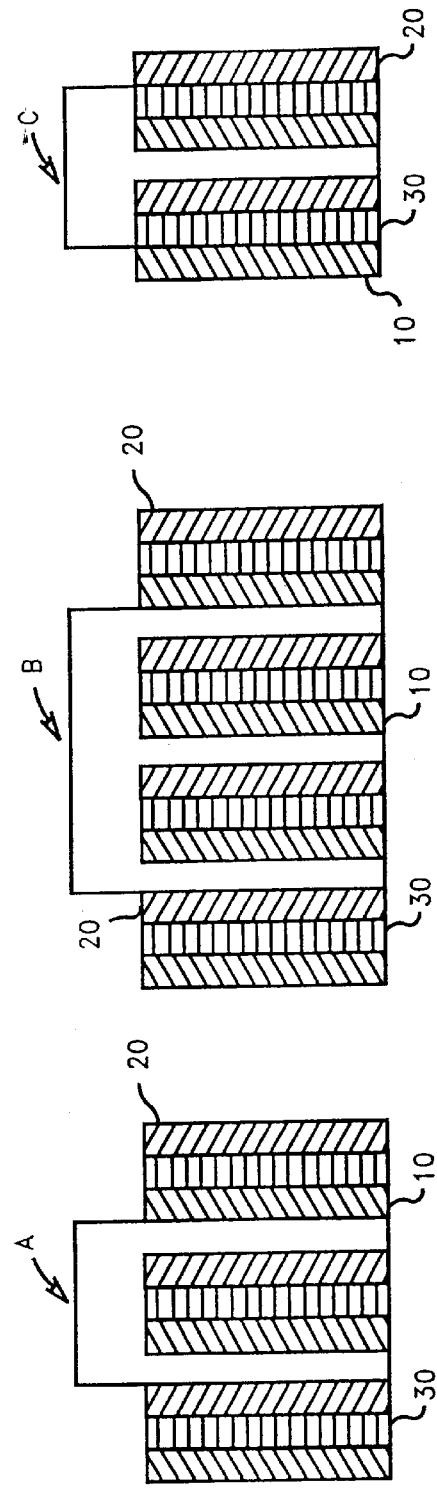
Figure 4:
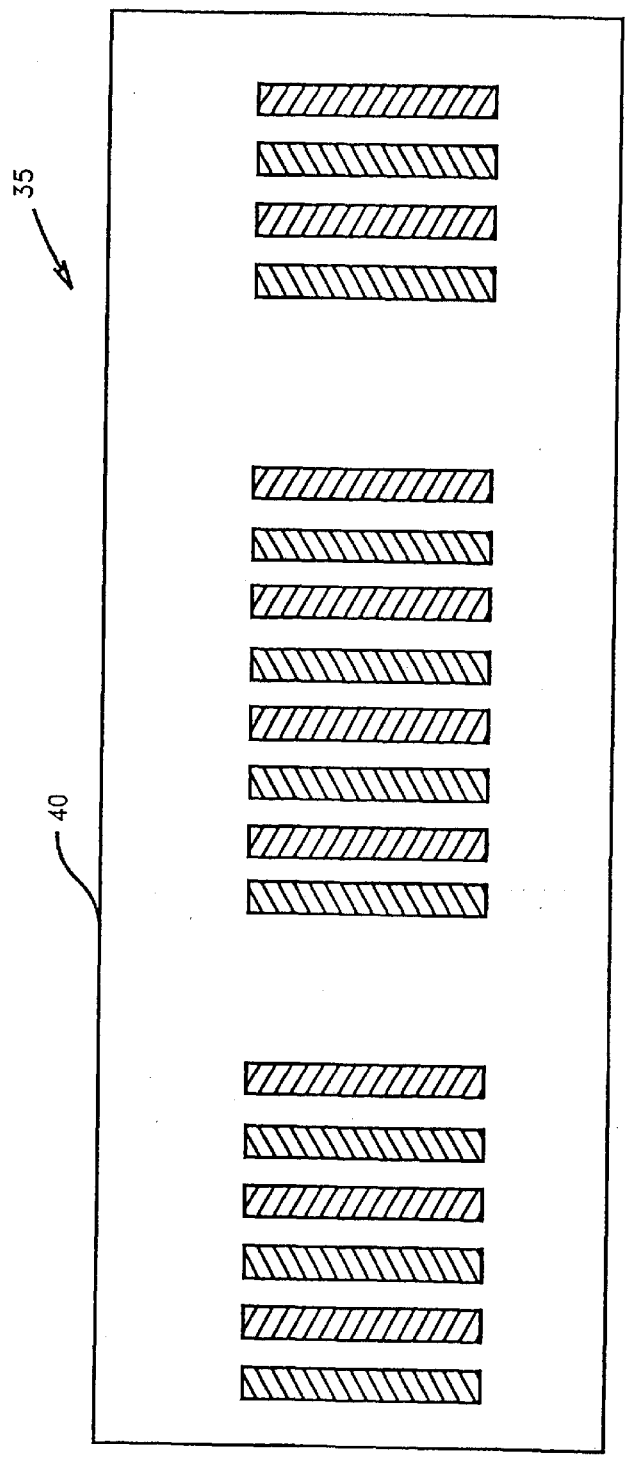

In a second preferred embodiment illustrated in FIGS. 8–10, the alternating phase regions are formed prior to forming the opaque auxiliary phase regions. As seen in FIG. 8, multiple narrow alternating phase regions are formed as a first step of the current embodiment. Again, phase regions 10 are 180° out of phase and phase regions 20 are 0° out of phase. Recall that the width of the phase regions are substantially equal to the width between the most nested lines as in line region A. Once the alternating phase regions are in place, opaque auxiliary phase transitions 30 are formed between the alternating phase regions as illustrated in FIG. 9.

In accordance with this embodiment of the present invention, additional alternating phase regions 10A and 20A are formed alongside the auxiliary phase transitions created in the previous step discussed above (see FIG. 10). Additional auxiliary phase transitions and additional alternating phase regions may be added as desired or until the spaces between the line regions no longer remain. The phase shifted mask layout is subjected to the double exposure lithography with a trim mask to generate the desired layout as discussed in the first embodiment. An example of the enhanced phase shifted mask layout 100 may be seen in FIG. 11 wherein the desired image shown in the solid black lines has a plurality of alternating phase regions 110 and 120 and auxiliary phase transitions 130.

Thus, in accordance with the methodology of the present invention, by forming the grating pattern using auxiliary phase transitions and formation of multiple, uniform alternating phase regions, the common process window in altPSM double exposure lithography is optimized in the presence of lens aberrations. Superior linewidth quality is obtainable in the presence of lens aberrations while existing manufacturing schemes and currently installed tool sets are still used to practice the instant invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of improving across field line width variation in alternating phase shifted mask lithography comprising the steps of:
   providing a chip layout having a plurality of features;
   determining which of the plurality of features are critical features;
   forming a plurality of phase regions on either side of the critical features such that a grating pattern of substantially uniform pitch is formed on a mask layout;
   providing a complementary mask pattern to selectively erase undesired printed images of the grating pattern; and
   reconstructing features of the chip layout to form a desired mask layout.

2. The method of claim 1 further including the step of:
   forming auxiliary phase transitions as determined by available space between the plurality of phase regions such that grating pattern of substantially uniform pitch is formed on a mask layout comprising the plurality of features and the auxiliary phase transitions.

3. The method of claim 2 wherein during the step of forming auxiliary phase transitions, a width of the auxiliary phase transition is substantially equal to a width of a most narrow one of the critical features.

4. The method of claim 2 wherein during the step of forming auxiliary phase transitions, a minimum spacing required to form the auxiliary phase transition is substantially equal to two phase regions widths plus one auxiliary phase transition width.

5. The method of claim 1 further including the steps of:
   forming auxiliary phase transitions determined by available space surrounding the critical features; and
   forming additional phase regions on either side of the auxiliary phase transitions as needed.

6. The method of claim 1 wherein in the step of forming a plurality of phase regions, a width of each phase region is substantially equal to a minimum spacing between the critical shapes.

7. The method of claim 1 wherein the step of providing a complementary mask pattern comprises providing a bright field block mask when the mask layout comprises a dark field alternating phase shifted mask.

8. The method of claim 1 wherein the step of providing a complementary mask pattern comprises providing a dark field trim mask when the mask layout comprises a bright field alternating phase shifted mask.

9. The method of claim 1 wherein in the step of forming alternating phase regions, the phase regions formed on either side of the critical features are substantially different by 180°.

10. The method of claim 1 wherein in the step of forming alternating phase regions, the phase regions formed on either side of the critical features are about 0° and about 180°.

11. The method of claim 1 wherein the step of forming phase regions of uniform width enhances across field line width variation by reducing sensitivity of the mask layout to lens aberrations and proximity effects.

12. The method of claim 1 wherein the step of forming phase regions of uniform width enhances across field line width variation by reducing sensitivity of the mask layout to phase width dependent line width bias.

13. A method of reducing the effects of lens aberrations in alternating phase shifted mask lithography comprising the steps of:
   providing a chip layout having a plurality of features;
   determining which of the plurality of features are critical features;
   forming auxiliary phase transitions as determined by available space surrounding the critical features;
   forming phase regions of uniform width on either side of the critical features and the auxiliary phase transitions such that a grating pattern of substantially uniform pitch is formed on a mask layout;
   providing a complementary mask pattern to selectively delete any undesired printed images of the grating pattern; and
   reconstructing the features of the chip layout by deleting any undesired printed images of the grating pattern with the complementary mask pattern.

14. The method of claim 13 wherein the step of forming phase regions is determined by available spacing between the critical features of the mask layout.

15. The method of claim 13 wherein during the step of forming phase regions, each phase region is substantially equal in width to a minimum spacing between critical features.

16. The method of claim 13 wherein during the step of forming auxiliary phase transitions, a width of the auxiliary phase transition is substantially equal to a width of a most narrow one of the critical features.

17. The method of claim 13 wherein the step of providing a complementary mask pattern comprises providing a bright field block mask when the mask layout comprises a dark field alternating phase shifted mask.

18. The method of claim 13 wherein the step of providing a complementary mask pattern comprises providing a dark field trim mask when the mask layout is a bright field alternating phase shifted mask.

19. The method of claim 13 wherein in the step of forming phase regions, the phase regions formed on either side of the critical features are substantially different by 180°.

20. The method of claim 13 wherein in the step of forming phase regions, the phase regions formed on either side of the critical features are about 0° and about 180°.

21. The method of claim 13 wherein the step of forming phase regions enhances across field line width variation by reducing sensitivity of the mask layout to lens aberrations and proximity effects.

22. The method of claim 13 wherein the step of forming phase regions enhances across field line width variation by reducing sensitivity of the mask layout to phase width dependent line width bias.

23. The method of claim 13 wherein in the step of forming phase regions of uniform width, the phase regions on either side of the critical features are of an arbitrary phase differing by about 180°.

24. A method of generating a mask layout comprising the steps of:

provided a chip layout having a plurality of features;

determining which of the plurality of features are critical features;

forming phase regions of uniform width on either side of the critical features, the width of the phase regions substantially equal to a minimum spacing between the critical features, the phase regions alternating by about 180°;

forming auxiliary phase transitions as determined by available space between the phase regions such that a grating pattern of substantially uniform pitch is formed on a mask layout comprising the critical features and the auxiliary phase transitions;

forming additional phase regions alongside the auxiliary phase transitions;

providing a complementary mask pattern to selectively delete any undesired printed images of the grating pattern; and reconstructing the critical features of the mask layout by deleting any undesired printed images of the grating pattern with the complementary mask pattern.

25. The method of claim 24 further including the step of printing the mask layout using a first exposure such that a grating pattern is formed in an exposed photoresist layer of a target substrate.

26. The method of claim 24 further including the step of printing the complementary mask pattern using a second exposure to delete any undesired printed images of the grating pattern formed in a first exposure.

27. The method of claim 24 wherein the step of forming phase regions provides multiple, narrow phase regions alongside the critical features reducing sensitivity to lens aberrations and proximity effects.

28. The method of claim 24 wherein the step of forming phase regions provides multiple, narrow phase regions alongside the critical features reducing sensitivity to phase width dependent line width bias.

29. The method of claim 24 wherein in the step of forming phase regions, a width of each phase region is substantially equal to a minimum spacing between the critical shapes.

30. The method of claim 24 wherein the step of providing a complementary mask pattern comprises providing a bright field block mask when the mask layout comprises a dark field alternating phase shifted mask.

31. The method of claim 24 wherein the step of providing a complementary mask pattern comprises providing a dark field trim mask when the mask layout comprises a bright field alternating phase shifted mask.

32. The method of claim 24 wherein in the step of forming alternating phase regions, the phase regions formed on either side of the critical features are substantially different by 180°.

33. The method of claim 24 wherein in the step of forming alternating phase regions, the phase regions formed on either side of the critical features are about 0° and about 180°.

* * * * *

UNITED STATES PATENT AND TRADEMARK OFFICE
CERTIFICATE OF CORRECTION

PATENT NO.   : 6,338,922 B1
DATED        : January 15, 2002
INVENTOR(S)  : Lars W. Liebmann et al.

It is certified that error appears in the above-identified patent and that said Letters Patent is hereby corrected as shown below:

<u>Drawings,</u>
Please replace the informal drawings, sheets 1-11, with the attached formal drawings, sheet 1-11.

Signed and Sealed this

Sixth Day of August, 2002

*Attest:*

*Attesting Officer*

JAMES E. ROGAN
*Director of the United States Patent and Trademark Office*

(12) United States Patent
Liebmann et al.

(10) Patent No.: US 6,338,922 B1
(45) Date of Patent: Jan. 15, 2002

(54) OPTIMIZED ALTERNATING PHASE SHIFTED MASK DESIGN

(75) Inventors: Lars W. Liebmann, Poughquag; Alfred K. Wong, Beacon, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/566,885

(22) Filed: May 8, 2000

(51) Int. Cl.⁷ .......................... G03F 9/00; G06F 17/50
(52) U.S. Cl. ............................................ 430/5; 716/21
(58) Field of Search .................... 430/5, 322; 716/19, 716/20, 21; 250/492.22

(56) References Cited

U.S. PATENT DOCUMENTS

| | | | |
|---|---|---|---|
| 5,537,648 A | 7/1996 | Liebmann et al. | 395/500 |
| 5,636,131 A | 6/1997 | Liebmann et al. | 716/19 |
| 5,807,649 A | 9/1998 | Liebmann et al. | 430/5 |
| 5,858,580 A | 1/1999 | Wang et al. | 430/5 |
| 5,883,813 A | 3/1999 | Kim et al. | 716/19 |
| 6,057,063 A * | 5/2000 | Liebmann et al. | 430/5 |

OTHER PUBLICATIONS

Levenson, M. D., *Phase–Shifting Mask Strategies: Isolated Dark Lines*. Microlithography World, (Mar./Apr. 1992) pp. 6–12.

Friedrich, Christoph et al., *Evaluating the Potential of Alternating Phase Shift Masks Using Lithography Simulation*, SPIE vol. 3679, pp. 590–599, Jul. 1999.

* cited by examiner

*Primary Examiner*—S. Rosasco
(74) *Attorney, Agent, or Firm*—DeLio & Peterson, LLC; Peter W. Peterson; Susan M. Murray

(57) ABSTRACT

A method for reducing lens aberrations sensitivity and proximity effects of alternating phase shifted masks is described. The critical features of a chip design layout are first identified. Multiple, narrow phase regions and auxiliary phase transitions, which provide additional opaque features, are then formed alongside the critical features such that a grating pattern of substantially uniform pitch is printed. Together with a complementary trim mask, the circuit pattern so delineated has reduced sensitivity to lens aberrations and proximity effects.

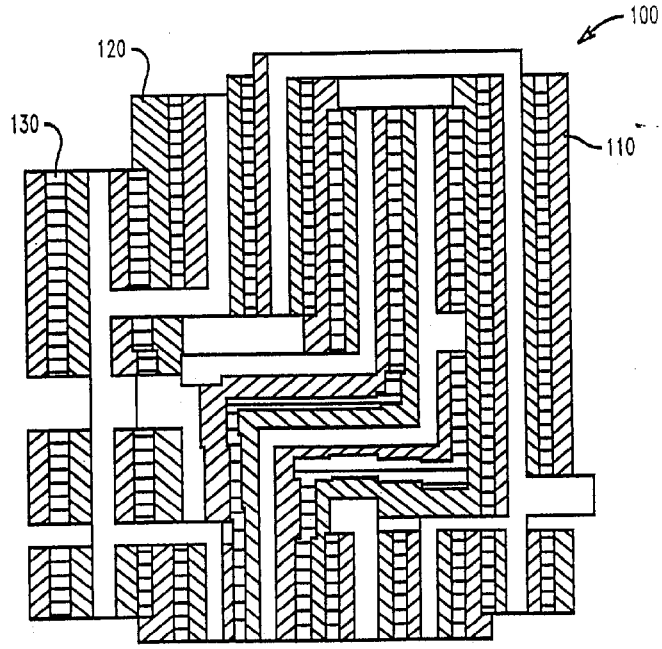

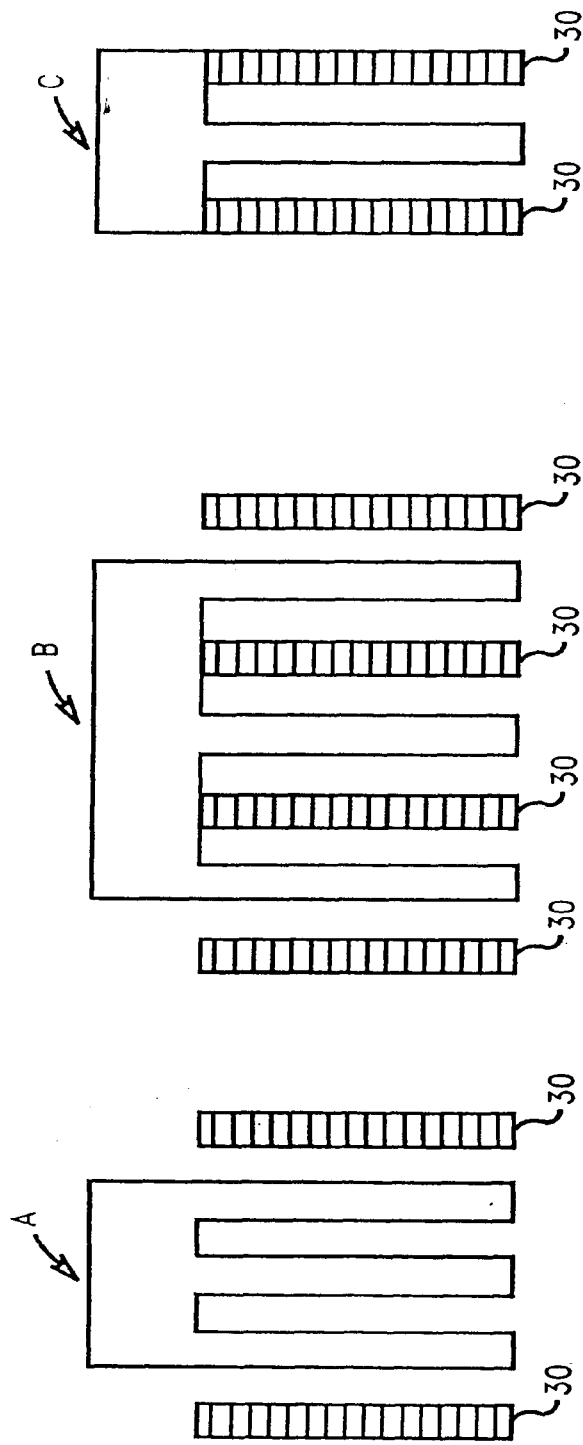

33 Claims, 11 Drawing Sheets